United States Patent
Cox et al.

(10) Patent No.: US 11,329,612 B2
(45) Date of Patent: May 10, 2022

(54) INTERFACE CELL FOR CIRCUIT ADJUSTMENT

(71) Applicant: Analog Devices International Unlimited Company, Limerick (IE)

(72) Inventors: Jeffry Alan Cox, Waltham, MA (US); John Kenneth Fiorenza, Carlisle, MA (US); Greg L. Disanto, Groton, MA (US)

(73) Assignee: Analog Devices International Unlimited Company, Limerick (IE)

( * ) Notice: Subject to any disclaimer, the term of this patent is extended or adjusted under 35 U.S.C. 154(b) by 56 days.

(21) Appl. No.: 16/698,460

(22) Filed: Nov. 27, 2019

(65) Prior Publication Data

US 2021/0159857 A1    May 27, 2021

(51) Int. Cl.
*H03F 1/30* (2006.01)
*H03F 3/45* (2006.01)

(52) U.S. Cl.
CPC ........... *H03F 1/30* (2013.01); *H03F 3/45071* (2013.01); *H03F 2203/45538* (2013.01)

(58) Field of Classification Search
CPC .................. H03F 1/30; H03F 3/45071; H03F 2203/45538
USPC ..................................... 330/252–261, 9, 307
See application file for complete search history.

(56) References Cited

U.S. PATENT DOCUMENTS

| | | | |
|---|---|---|---|
| 4,242,730 A | 12/1980 | Butts et al. | |
| 6,366,154 B2 | 4/2002 | Pulvirenti | |
| 6,621,284 B2 | 9/2003 | D'Angelo et al. | |
| 6,628,169 B2 | 9/2003 | Ivanov et al. | |
| 7,420,359 B1 | 9/2008 | Anderson | |
| 7,436,222 B2 | 10/2008 | Shyr et al. | |
| 7,782,083 B2 | 8/2010 | Lalithambika et al. | |

(Continued)

FOREIGN PATENT DOCUMENTS

| | | |
|---|---|---|
| CN | 1444796 A | 9/2003 |
| CN | 101958688 B | 9/2014 |
| CN | 104656006 A | 5/2015 |

OTHER PUBLICATIONS

"MT-037 Tutorial: Op Amp Input Offset Voltage", Analog Devices, Inc., (2009), 10 pgs.

(Continued)

*Primary Examiner* — Hieu P Nguyen
(74) *Attorney, Agent, or Firm* — Schwegman Lundberg & Woessner, P.A.

(57) ABSTRACT

An interface cell for circuit adjustment can be structured to adjust parameters of a circuit of an integrated circuit. The interface cell can be implemented in a small area on a die for the integrated circuit. The interface cell can be arranged for circuit adjustment, such as post package trim of the circuit. The interface cell can include a control device and a low voltage circuit. The control device can be implemented as a single device, or a device having a limited number of additional components, that interfaces a high voltage domain to a low voltage domain of the low voltage circuit. The control device can be enabled to provide the signals to the low voltage circuit of the interface cell to adjust parameters of the circuit and can be disabled to isolate the circuit from the interface cell after providing the signals to the low voltage circuit.

20 Claims, 3 Drawing Sheets

(56) References Cited

U.S. PATENT DOCUMENTS 9,602,089 B2\* 3/2017 Iwamoto ............... H03K 5/007
2016/0119990 A1 4/2016 Williams et al.

OTHER PUBLICATIONS

Mohamed, Ahmed Reda, et al., "Input Offset Cancellation Trimming Technique for Operational Amplifiers", IEEE Saudi International Electronics, Communications and Photonics Conference, (2013), 5 pgs.

\* cited by examiner

INTERFACE CELL FOR CIRCUIT ADJUSTMENT

FIELD OF THE DISCLOSURE

This document relates to electrical circuits and in particular to circuits to adjust parameters in integrated circuits.

BACKGROUND

Many state of the art operational amplifiers require key specifications to be trimmed via a series of programmable fuse registers after die packaging. Trimming an electronic device is a procedure of compensating for process and part-to-part variations in the electronic device. A post package trim technique is utilized to mitigate parametric shifts due to die stresses encountered during the packaging and bonding process, which can degrade the operational amplifiers performance. An ideal implementation would in no way negatively impact critical specifications, die size, or power and would be fully transparent to a user application employing an operational amplifier.

SUMMARY OF THE DISCLOSURE

An interface cell for circuit adjustment can be structured to adjust parameters of a circuit of an integrated circuit. The interface cell can be implemented in a small area on a die for the integrated circuit. The interface cell can be arranged for circuit adjustment, such as post package trim of the circuit. The interface cell can include a control device and a low voltage circuit. The control device can be implemented as a single device, or a device having a limited number of additional components, that interfaces a high voltage domain to a low voltage domain of the low voltage circuit. The control device can be enabled to provide the signals to the low voltage circuit of the interface cell to adjust parameters of the circuit and can be disabled to isolate the circuit from the interface cell after providing the signals to the low voltage circuit.

For example, an integrated circuit having circuitry to program a circuit of the integrated circuit can be provided that comprises: translation circuitry to provide information to program the circuit of the integrated circuit; and a device coupled to an input of the circuit and to the translation circuitry to provide a signal from the input of the circuit to the translation circuitry such that the device interfaces a voltage domain to the translation circuitry with the voltage domain being high relative to operating voltage of the translation circuitry.

A method of operating an integrated circuit to program a circuit in the integrated circuit can comprise: enabling a device coupled to translation circuitry and coupled to an input of the circuit of the integrated circuit, wherein the device interfaces a voltage domain to the translation circuitry with the voltage domain being high relative to operating voltage of the translation circuitry; providing a signal at the input of the circuit to provide information from the translation circuitry to logic circuitry to program the circuit, with the device enabled to an on-state; and controlling the signal to provide a digital output from the translation circuitry to the logic circuitry.

In various embodiments, an apparatus having circuitry to program a circuit of the apparatus can comprise: a means to translate information from a signal at an input of the circuit to logic circuitry to program the circuit; and a device coupled to the input of the circuit and coupled to the means to translate information to provide the signal from the input of the circuit to the means to translate information such that the device interfaces a voltage domain to the means to translate information, wherein the voltage domain is high relative to operating voltage of the means to translate information.

BRIEF DESCRIPTION OF THE DRAWINGS

The drawings, which are not necessarily drawn to scale, illustrate generally, by way of example, but not by way of limitation, various embodiments discussed in the present disclosure.

DETAILED DESCRIPTION

Figure 1:
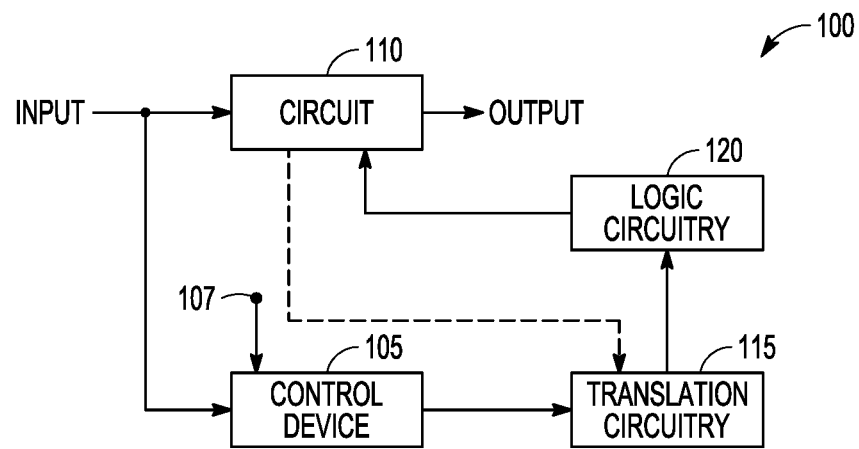
FIG. 1 is an illustration of an example integrated circuit having circuitry to program a circuit of integrated circuit, according to various embodiments.

In various embodiments, a device within an integrated circuit can be connected to low voltage level translation circuitry allowing information to be sent to a circuit within the integrated circuit. The information can be information to program or adjust one or more parameters of the circuit. The device can be turned off, isolating the translation circuitry from the circuit, after the circuit is programmed with the one or more parameters. The circuit of the integrated circuit can be a circuit having a parameter to be adjusted due to process and part-to-part variations in the construction or packaging of the integrated circuit. The circuit arranged to receive information can be an amplifier arranged to receive trim information, though other circuits performing a function in the normal operation of the integrated circuit can be adjusted with such translation circuitry. In various embodiments, the integrated circuit can be a standalone amplifier circuit. This amplifier can be one of several types of amplifiers including an operational amplifier.

The device, to connected to low voltage level translation circuitry, can be implemented in a number of different forms. For instance, the device can be a high-voltage n-channel field effect enhancement mode device or other transistor implementation. It can be arranged as a single device connecting the low voltage level translation circuitry to a higher voltage domain than the operating voltage of the low voltage level translation circuitry. The higher voltage domain can be at an input of the circuit having a parameter adjusted. The low voltage level translation circuitry can use a small amount of area on the die of the integrated circuit to provide an interface cell for adjustment of a circuit of the integrated circuit, which enables a number of translation circuits to be constructed on the die.

Architectures, having a device connecting a relatively high voltage domain to a low voltage level translation circuitry to control the provisioning of information to be sent to a circuit within an integrated circuit, can be implemented as an interface cell in the integrated circuit for circuit adjustment of the circuit arranged to receive the information.

The relatively high voltage domain is a domain having an operational voltage that when used in the low voltage level translation circuitry would damage the low voltage level translation circuitry. An architecture of such an interface cell can be structured to be area efficient. The interfacing device can be structured with a small number of components. For example, the use of a single high-voltage device to perform the interface task minimizes the impact on die area. An architecture with such an interface cell can be structured to be power efficient. The high voltage device can be connected such that it can be disabled after circuit adjustment, such as post package trim, has been completed. The circuit adjustment is not limited to post package trim. An architecture with such an interface cell can be structured to be highly transparent. The terminal connected to the high voltage device can be arranged to remain in high impedance when subsequent circuitry is disabled.

To avoid changing pin-out and package size, one or more terminals of a circuit can be implemented to perform double duty, functioning as both a standard input-output pin and a mechanism by which trim information or other information can be delivered into the circuit. This can be problematic for some circuits such as operational amplifiers, because input and output terminals of operational amplifiers are the most sensitive with respect to potentially compromising performance. Terminals that interface with the outside world should be robust enough to handle ESD strikes and various over voltage conditions. Conventional approaches use protection devices that are area intensive in an integrated circuit. In various embodiments in contrast to conventional approaches, interface cells in an integrated circuit for circuit adjustment, such as post-processing trim, can be implemented using relatively small die area using a device to interface the high voltage domain of the operational circuit to a low voltage domain that provides adjustment parameters to the operational circuit. After adjusting the part, this interface can be disabled with no impact to the inputs of the part, which basically, achieves complete transparency to a user application of the part. Entirely shutting down adjustment circuitry via the interface, after adjusting the part, can result in the user application of the part experiencing no additional power consumption.

FIG. 1 is an illustration of an embodiment of an example integrated circuit 100 having circuitry to program a circuit 110 of integrated circuit 100. Programming can include providing parameters for adjustment of a component of an electronic device or system. Integrated circuit 100 can include, in addition to circuit 110, logic circuitry 120 to program circuit 110 and translation circuitry 115 to provide information to program circuit 110. In various embodiments, integrated circuit 100 can be implemented as circuit 110. Logic circuitry 120 can be implemented within circuit 110. For example, circuit 110 can include a number of latches internal to circuit 110, where the latches can receive a data signal that is propagated by translation circuitry 115. The data signal received in these latches can be used to trim parameters of circuit 110 such as, but not limited to, offset parameters and common mode rejection parameters for circuit 110. The provision of the information to translation circuitry 115 can be executed by the use of a control device 105. The information to program circuit 110 can be transmitted to logic circuitry 120 based on action of control device 105, where logic circuitry 120 can generate signals to circuit 110 to program one of more parameters of circuit 110. Logic circuitry 120 can be structured with translation circuitry 115 in an integrated manner.

In this example embodiment shown in FIG. 1, control device 105 is coupled to an input of circuit 110 and to translation circuitry 115 to provide a signal from the input of circuit 110 to translation circuitry 115 such that control device 105 interfaces a voltage domain of the input of circuit 110 to the translation circuitry 115, with the voltage domain being high relative to operating voltage of the translation circuitry 115. Control device 105 can be coupled to an enable node 107 to receive an enable signal that controls current flow from an input side of control device 105 to translation circuitry 115. The enable signal can be a bias signal to control device 105 that is biased relative to the operating voltage of circuit 110, which allows translation of an input signal between the two domains: the input to circuit 110 and translation circuitry 115. The input of circuit 110 can be in a voltage domain for operating circuit 110, which can be higher than allowable for translation circuitry 115, since translation circuitry 115 can be designed to occupy limited die space by using reduced-size components that have limited operating range.

Control device 105 can isolate translation circuitry 115 from circuit 110, when control device 105 is in an off-state. Control device 105 can include a transistor. For example, the transistor can be an n-channel field effect enhancement mode device, a p-channel field effect enhancement mode device, an n-channel or a p channel depletion mode device and a transmission gate shorting the gate of the high voltage device to the source, or any other kind of transistor such as but not limited to a junction field effect transistor, a bipolar junction transistor, or other similar device. The transistor can be implemented as a single control device or a control element with a limited number of components, with the control of the transistor, such as a gate of a field effect transistor, biased relative to the operating voltage of circuit 110 that allows translation between the two abovementioned domains.

Translation circuitry 115 can be structured in a number of configurations to provide information from the input of control device 105, which is coupled from the input to circuit 110, to logic circuitry 120. Translation circuitry 115 can be arranged to receive reference signals from circuit 110 such as, but not limited to, current from current sources that are used as bias circuitry for trim of circuit 110. Translation circuitry 115 can include a comparator to provide the information to logic circuitry 120 of integrated circuit 100 to program circuit 110. Translation circuitry 115 can include a resistance to limit current over full range of operation of control device 105. With control device 105 realized as a transistor, the resistance can limit the current over full range of the transistor from linear or triode operation of the transistor to saturation operation of the transistor. This resistance can be implemented in a number of ways, for example, by a resistor or an active device arranged as a resistor when translation circuitry 115 is active.

Circuit 110 is a functional circuit of the integrated circuit that operates in integrated circuit 100 to perform a task. Circuit 110 takes part in the normal operation of integrated circuit 100 in which a signal at the input of circuit 110 results in a signal at an output of circuit 110 to be used in the application for which circuit 110 is designed. On the other hand, translation circuitry 115 and logic circuitry 120 are active to adjust one or more parameters of circuit 110, which adjustment is not part of the normal operation of circuit 110. Circuit 110 can be implemented as an amplifier. An enable signal can be provided to enable node 107 to turn on control device 105 to provide information for adjustment of one or more parameters of circuit 110. The enable signal can be a signal generated relative to the operating voltage of circuit 110. The enable signal can be provided using a controller or processing device of integrated circuit 100 or can be provided to enable node 107 arranged as a pin of integrated circuit 100. With circuit 110 being an amplifier, the information provided for adjustment can be trim information to trim the amplifier. Depending on the structure and function of circuit 110, the information to adjust one or more parameters of circuit 110 can include serial numbers, measured test results, or other data.

Figure 2:
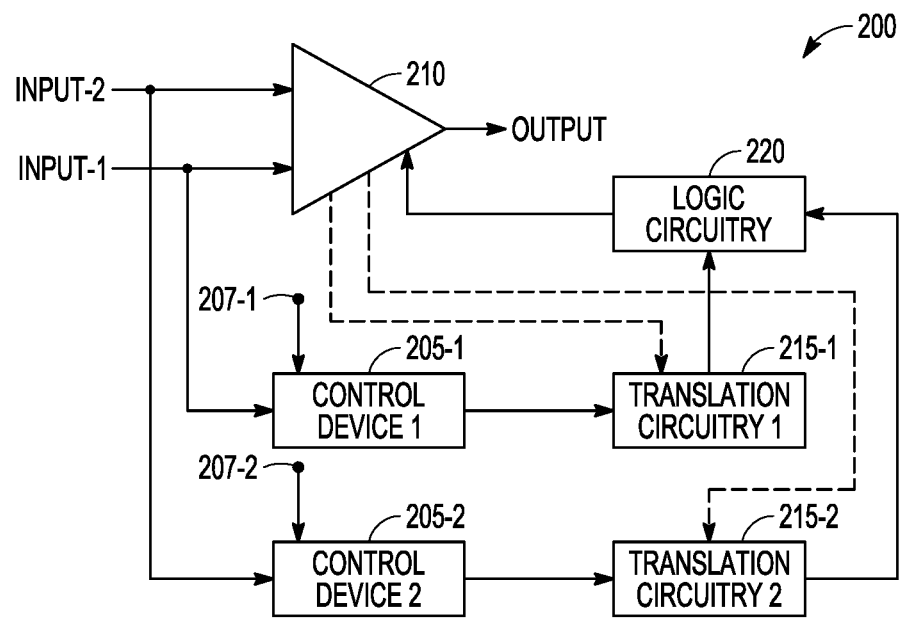
FIG. 2 is an illustration of an example integrated circuit having circuitry to program a circuit of integrated circuit, where the circuit includes multiple inputs, according to various embodiments.

FIG. 2 is an illustration of an embodiment of an example integrated circuit 200 having circuitry to program a circuit 210 of integrated circuit 200, where circuit 210 includes multiple inputs. Though two inputs, input-1 and input-2, are shown in FIG. 2, circuit 210 can include more than two inputs depending on the function of circuit 210. Circuit 210 provides an output based on signals received at input-1 and input-2. Integrated circuit 200 can include, in addition to circuit 210, logic circuitry 220 to program circuit 210 and translation circuitry 215-1 along with translation circuitry 215-2 to provide information to program circuit 210. Logic circuitry 220 can be implemented within circuit 210. For example, circuit 210 can include a number of latches internal to circuit 210, where the latches can receive a data signal that is propagated by translation circuitry 215. The data signal received in these latches can be used to trim parameters of circuit 210 such as, but not limited to, offset parameters and common mode rejection parameters for circuit 210.

The provision of a portion of the information to translation circuitry 215-1 can be executed by the use of a first control device 205-1. The provision of another portion of the information to translation circuitry 215-2 can be executed by the use of a control device 205-2. The information to program circuit 210 can be transmitted to logic circuitry 220 based on action of control device 205-1 and control device 205-2, where logic circuitry 220 can generate signals to circuit 210 to program one of more parameters of circuit 210. Alternatively, logic circuitry 220 can be implemented as two structures of logic circuitry: one to receive information from an input-1 of circuit 210 via control device 205-1 and one to receive information from an input-2 of circuit 210 via control device 205-1. The information can include data generated using a data signal and a clock signal provided by control device 205-1 and control device 205-2.

Control device 205-1 can be structured in manner similar to the structure of control device 205-2. In addition, control device 205-1 and control device 201-2 can be implemented similar to control device 105 of FIG. 1. Translation circuitry 215-1 can be structured in manner similar to the structure of translation circuitry 205-2. Further, translation circuitry 215-1 and translation circuitry 215-2 can be implemented similar to translation circuitry 115 of FIG. 1. Each of translation circuitry 215-1 and translation circuitry 215-2 can be arranged to receive reference signals from circuit 210 such as, but not limited to, current from current sources that are used as bias circuitry for trim of circuit 210. Both control device 205-1 and control device 205-2 can be structured to interface a voltage domain that is high relative to operating voltage of translation circuitry 215-1 and translation circuitry 215-2, respectively.

In addition to coupling to input-1 of circuit 210, control device 205-1 can be coupled to an enable node 207-1. In addition to coupling to input-2 of circuit 210, control device 205-2 can be coupled to an enable node 207-2. An enable signal at enable node 207-1 can turn on control device 205-1 to provide a first signal to logic circuitry 220 and an enable signal at enable node 207-2 can turn on control device 205-2 to provide a second signal to logic circuitry 220. The first and second signals can be a data signal and a clock signal. With circuit 210 being an amplifier, the data signal and the clock signal can be used to trim amplifier 210. The enable signal at enable node 207-1 can be changed to turn off control device 205-1, effectively isolating translation circuitry 215-1 from circuit 210. The enable signal at enable node 207-2 can be changed to turn off control device 205-2, effectively isolating translation circuitry 215-2 from circuit 210. The enable signals at enable node 207-1 and enable node 207-2 can be provided using a controller or processing device of integrated circuit 200 or can be provided to enable node 207-1 and enable node 207-2 arranged as pins of integrated circuit 200. Alternatively, enable node 207-1 and enable node 207-2 can be arranged as one pin of integrated circuit 200 for coordinated enablement/disablement of control device 205-1 and control device 205-2.

Figure 3:
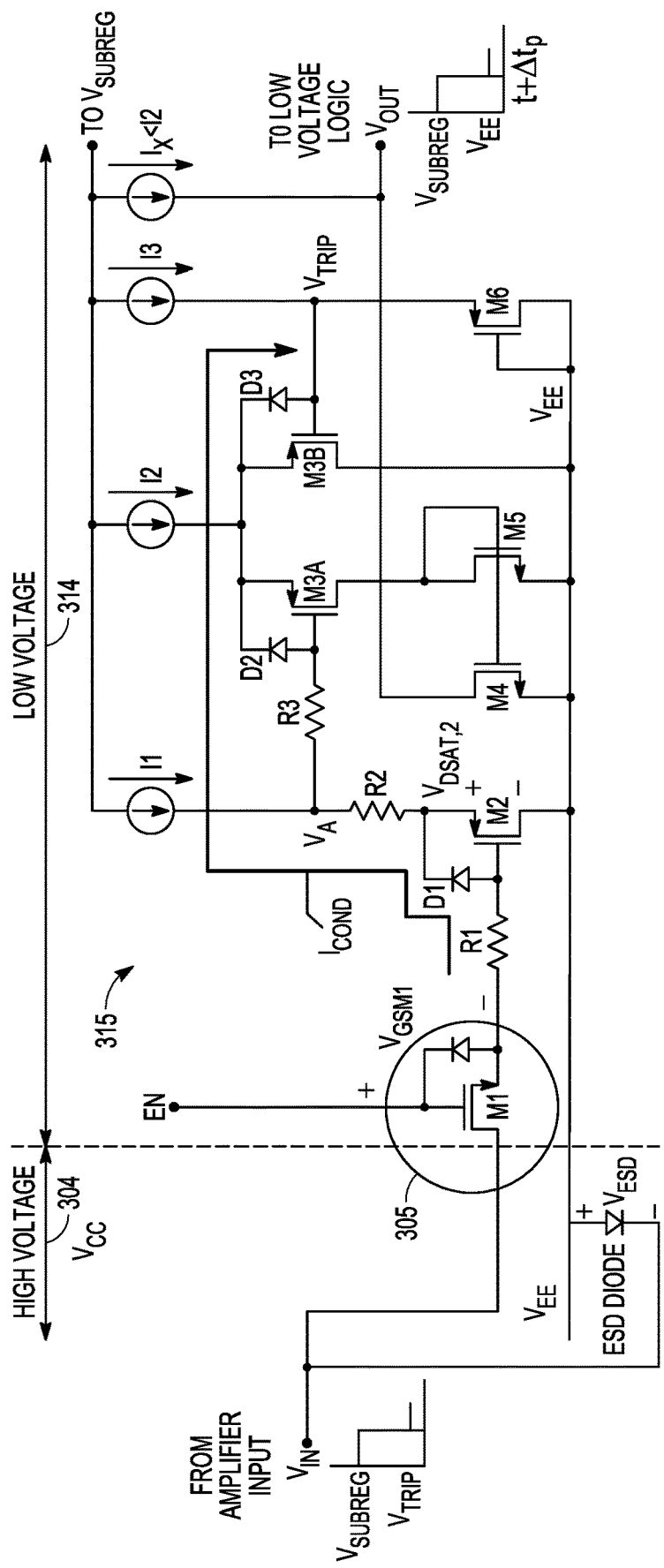
FIG. 3 is a schematic of an example interface circuitry between a circuit of an integrated circuit and logic circuitry of the integrated circuit, according to various embodiments.

FIG. 3 is a schematic of an embodiment of example interface circuitry between a circuit of an integrated circuit and logic circuitry of the integrated circuit. The logic circuitry can be implemented to program the circuit. As a non-limiting example, the circuit is taken to be an amplifier. The amplifier can be, but is not limited to, an operational amplifier circuit. The circuit can be another type of amplifier such as a fully differential amplifier, a current sense amplifier, or an instrumentation amplifier or something different like an analog-to-digital converter or reference circuit. The logic circuitry can be implemented within the circuit, such as within the amplifier. For example, the circuit can include a number of latches internal to the circuit, where the latches can receive a data signal that is propagated by translation circuitry. The data signal received in these latches can be used to trim parameters of the circuit such as, but not limited to, offset parameters and common mode rejection parameters for the circuit.

Shown in FIG. 3 are two domains, a high voltage domain 304 and a low voltage domain 314 of translation circuitry 315, separated from each other by a control device 305. High voltage domain 304 goes to high voltage circuitry, which occupies a large region in size in the integrated circuit relative to the low voltage domain 314 of translation circuitry 315 that is effectively realized as a small region in size in the integrated circuit. In this embodiment, control device 305 is a field effect transistor M1 having its source coupled to its gate by a diode. M1 is used as a go-between, between high voltage domain 304 and low voltage domain 314. As a result of its go-between function, it is made sufficiently large to operate with respect to high voltage domain 304. With use of a single control device 305, which can be realized by M1 having its source coupled to its gate by a diode, that operates to interface high voltage domain 304 with respect to low voltage domain 304 of translation circuitry 315, its size does not eliminate the incorporation of translation circuitry 315 in the integrated circuit to perform programming activities such as post-processing trim. High voltage domain 304 at a drain of M1 is high relative to the operating voltage of domain 314 of translation circuitry 315 coupled to the source of M1. M1 interfaces the input to the amplifier to translation circuitry 315.

The drain of M1 is connected directly to the input of the amplifier with the gate of M1 connected to an enable node (EN) 307 at the same potential as $V_{SUBREG}$. $V_{SUBREG}$ is an internally generated voltage in the amplifier used to run the digital components of the amplifier. The voltage value of $V_{SUBREG}$ is process dependent, depending on the voltage source devices available in its application. With operating voltage source rails of $V_{CC}$ and $V_{EE}$ with $V_{CC} > V_{EE}$, $V_{SUBREG}$ can be five volts or less above $V_{EE}$. Other low voltages for $V_{SUBREG}$ can be used.

The source of M1 is connected to a gate of transistor M2 through current limiting resistor R1. As $V_{IN}$ at the input of the amplifier is swept from $V_{EE}$ to a $V_T$ (threshold voltage of M1), with the voltage of M1 below $V_{SUBREG}$, device M1 will remain in triode and the source of M1 will follow the drain voltage of M1. As the drain voltage of M1 continues to increase, the device will be pulled out of triode and transitions to its saturation region. When VDS of M1 is greater than saturation voltage $V_{DSAT}$ of M1, M1 will be saturated with its gate voltage clamped to $V_{SUBREG}$. There is a forward conduction path $I_{COND}$ that can occur through resistor R1, diode D1, resistor R2, resistor R3, diode D2, diode D3 and possibly a parasitic of transistor M3B. This current may be limited by R1 and R2.

The drain of M1 can move up and down with the input voltage without any additional current penalty. After post package trim has been completed, the EN voltage connected to the gate of M1 can be collapsed to $V_{EE}$ to remove this conduction path for zero current consumption and zero power consumption. When $V_{IN}$ is pulled below $V_{EE}$, proper sizing of M2, M6, and R2 can allow voltage $V_A$ to trip a comparator formed by transistors M3A, M3B, M4 and M5 without turning on the ESD protection diode. Transistors M4 and M5 can be designed with the same characteristics such that the ratio of the size of M4 to the size of M5 is 1:1. Currents sources, coupled to the amplifier, with currents I1, I2, I3 . . . Ix can be used to operate the comparator, where Ix is less than I2. The voltage transition of this comparator may be interpreted as a digital signal at the output of translation circuitry 315 and converted to amplifier trim information by logic circuitry to which $V_{OUT}$ is provided.

The input voltage $V_{IN}$ from the amplifier input can be changed from $V_{SUBREG}$ at time t, to the voltage $V_{TRIP}$ of the comparator of translation circuitry 315. $V_{OUT}$ of translation circuitry 315 transitions from $V_{SUBREG}$ to $V_{EE}$ at time $t+\Delta t_p$, where $\Delta t_p$ is an associated delay. With a pin of the amplifier, also coupled to enable node 307 to perform double duty, an enable signal can be applied to the gate of M1 such that voltage of the enable signal is tied to a voltage above $V_{EE}$ sufficient to turn M1 on. M1 would enter its triode mode of operation, in which the drain of M1 would be conductively coupled to the source of M1, that is, the drain of M1 would be essentially shorted to the source of M1. The source of M1 would then follow the drain, up and down in voltage, as it moves with the input to the amplifier that is also an input to M1. When M1 is enabled into triode, the input voltage $V_{IN}$ is being impressed directly upon it, and upon the gate of transistor M2 whose gate voltage will follow $V_{IN}$, up and down in voltage. When $V_{IN}$ is pulled below the negative rail, or when it is pulled below $V_{EE}$, the voltage of the source of M2 is caused to go below a trip point that causes the comparator of translation circuitry 315, comprised of transistors M3A and M3B, to trip. That information as $V_{OUT}$ can be used as clock-in data to send trim information into the amplifier. When M1 is disabled by collapsing the enabled voltage at enable node 307 to $V_{EE}$, M1 turns off and its drain floats up and down with $V_{IN}$ and remains high impedance, with no impact on the input performance of the amplifier.

The interface circuit of FIG. 3 using control device 305 coupled to one input of the amplifier in conjunction with translation circuitry 315 can be implemented as control device 205-1 coupled to input-1 and translation circuitry 215-1 of FIG. 2 to provide an output at $V_{OUT}$ that is a clock signal. A similar or identical interface circuit to that of FIG. 3 can have another control device coupled to another input of the amplifier that can be implemented as control device 205-2 coupled to input-2 and translation circuitry 215-2 of FIG. 2 to provide an output of this similar or identical interface circuit that is a data signal. $V_{IN}$ of this other interface circuit can be pulled up and down with respect to the supply rail such that its low voltage comparator circuitry is biased in such a way that a data signal can be effectively generated. This can be performed by having $V_{IN}$ going below $V_{EE}$. If $V_{IN}$ goes sufficiently below $V_{EE}$, a zero is represented. If $V_{IN}$ goes sufficiently above VEE, a one is represented. That data signal, which varies with time, can be propagated into a number of latches internal to the amplifier and can be used to trim parameters of the amplifier such as, but not limited to offset parameters and common mode rejection parameters. Two interface circuits can be coupled to the amplifier with one interface circuit coupled to one input of the amplifier and the second interface circuit coupled to a second input of the amplifier such that clock information can be provided at one input and data information can be provided at the other input to trim the amplifier.

The interface circuitry of FIG. 3 can be implemented using a small region of a die of the integrated circuit in which it is disposed, providing area savings in the design of the integrated circuit and associated trim techniques. In addition, there is no power penalty. With the interface disabled, transparency is basically attained. Once the interface is disabled by turning off M1, $V_{SUBREG}$ can be lowered to $V_{EE}$ and the whole voltage supply can be collapsed relative to the interface so that the interface consumes no power. With $V_{SUBREG}$ to be used after M1 is turned off, the current sources I1, I2, I3 . . . Ix, which bias the circuitry that is used for the trim and is provided to translation circuitry 315, can be turned off so that the interface consumes no power.

Consider the case in which M1 is enabled and $V_{IN}$ is moved from the negative potential of $V_{EE}$ to $V_{SUBREG}$. M1 would remain triode. Basically, the input to the comparator of translation circuitry 315, or M2, would follow the input of the amplifier. When $V_{IN}$ is brought above $V_{SUBREG}$, this action gently pulls M1 out of triode. When M1 starts to conduct, there will be a current path through M2 and M3 (M3A and M3B). In some cases, this current path is not desired, if the amplifier is under test, since that extra current is not desired. In other cases, the extra current may be tolerable. To avoid disabling the interface circuitry while testing the amplifier, this extra current can be limited using R2 and R3. Transparency occurs when M1 is turned off and the current path $I_{COND}$ is not established.

In the implementation shown in FIG. 3, high voltage domain 304 and low voltage domain 314 are structured between rails $V_{CC}$ and $V_{EE}$, with M1 implemented as an enhancement mode NMOS device with $V_{OUT}$ taken between $V_{EE}$ and $V_{SUBREG}$. A complimentary implementation of this technique can be implemented. For example, a sub-regulated voltage can be developed from the positive rail with all low voltage circuitry operating from $V_{CC}$ to $V_{CC}-V_{SUBREG}$. A single interfacing, high voltage device used in this complimentary implementation would be an enhancement mode PMOS rather than the enhancement mode NMOS for M1. With another type of transistors used, the arrangement of this other type of transistor to translate a signal from high voltage domain 304 to low voltage domain 314 with a comparator circuit to provide parameters to the amplifier for trimming can be implemented with appropriate modifications of translation circuitry 315, based on characteristics of the other type of transistor. In addition, the architecture of FIG. 3, a complimentary version of the architecture, and a modified version of the architecture to use a different type of transistor as a control device can each be implemented to program a circuit that is different from an amplifier. In addition, the circuit can have more than two inputs with each input coupled to an interface cell. The information programmed can include information other than trim information such as, but not limited to, serial numbers, measured test results, or other data.

Figure 4:
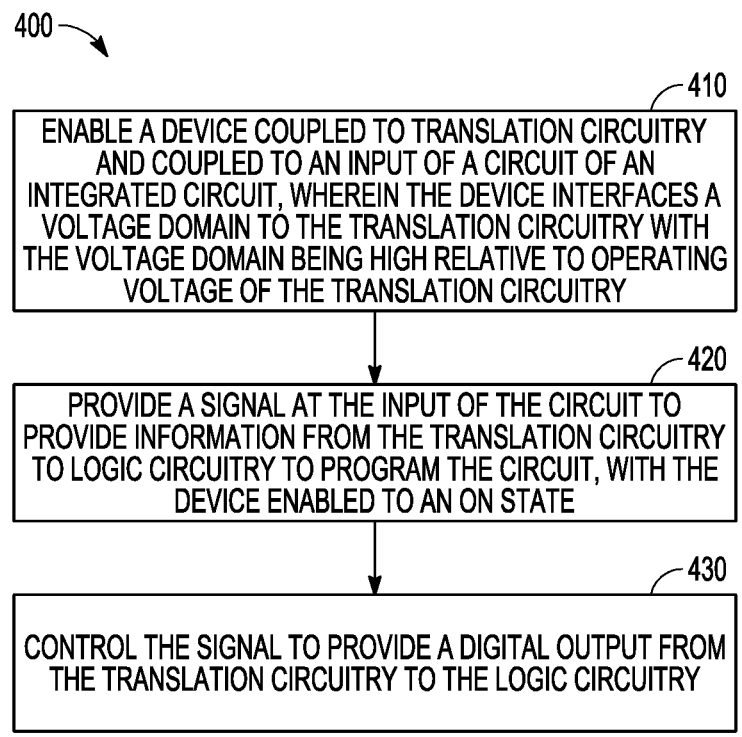
FIG. 4 is a flow diagram of features of an example method of operating an integrated circuit to program a circuit in the integrated circuit, according to various embodiments.

FIG. 4 is a flow diagram of features of an embodiment of an example method 400 of operating an integrated circuit to program a circuit in the integrated circuit. At 410, a device coupled to translation circuitry and coupled to an input of the circuit of the integrated circuit is enabled. The device interfaces a voltage domain to the translation circuitry with the voltage domain being high relative to operating voltage of the translation circuitry. At 420, a signal at the input of the circuit is provided to provide information from the translation circuitry to logic circuitry to program the circuit, with the device enabled to an on-state. The information can include information to program one or more parameters of the circuit. For example, the information can include trim information, serial numbers, or measured test results. At 430, the signal is controlled to provide a digital output from the translation circuitry to the logic circuitry.

Variations of method 400 or methods similar to the method 400 can include a number of different embodiments that may be combined depending on the application of such methods and/or the architecture of systems in which such methods are implemented. Such methods can include turning the device to an off-state, isolating the translation circuitry from the circuit. Variations of the method 400 or methods similar to the method 400 can include controlling the signal to provide a data signal to the logic circuitry. Such methods can include enabling a second device coupled to a second translation circuitry and coupled to a second input of the circuit, wherein the second device interfaces a voltage domain that is high relative to operating voltage of the second translation circuitry; providing a second signal at the second input of the circuit to provide information from the second translation circuitry to the logic circuitry to program the circuit, with the second transistor enabled to an on-state; and controlling the second signal to provide a clock signal from the second translation circuitry to the logic circuitry.

In various embodiments, an integrated circuit has circuitry to program a circuit of the integrated circuit. The integrated circuit can comprise translation circuitry to provide information to program the circuit of the integrated circuit. The integrated circuit can also include a device coupled to an input of the circuit and to the translation circuitry to provide a signal from the input of the circuit to the translation circuitry such that the device interfaces a voltage domain to the translation circuitry with the voltage domain being high relative to operating voltage of the translation circuitry. The information can be information to program one or more parameters of the circuit. With the circuit including an amplifier, the information is trim information to trim the amplifier.

The device can be coupled to an enable node to receive an enable signal that controls current flow from an input side of the device to the translation circuitry. The device can isolate the translation circuitry from the circuit, when the device is in an off-state. The device can include a transistor. The integrated circuit can be implemented with this transistor realized using a n-channel field effect enhancement mode device, a p-channel field effect enhancement mode device, n or p channel depletion mode devices and a transmission gate shorting the gate of the high voltage device to the source of the transistor, or any other kind of transistor. The translation circuitry can include a comparator to provide the information to logic circuitry of the integrated circuit to program the circuit. The translation circuitry can include a resistance to limit current over full range of operation of the device.

Variations of such an integrated circuit or similar integrated circuits can include a number of different embodiments that may be combined depending on the application of such integrated circuits and/or the architecture of systems in which such integrated circuits are implemented. The integrated circuit can include second translation circuitry to provide additional information to program the circuit; and a second device coupled to the second translation circuitry to provide a second signal from a second input of the circuit to the second translation circuitry such that the second device interfaces a voltage domain that is high relative to operating voltage of the second translation circuitry. Variations of such integrated circuit or similar integrated circuits can include the translation circuitry being operable to output a data signal to logic circuitry of the integrated circuit and the second translation circuitry is operable to output a clock signal to the logic circuitry.

In various embodiments, an apparatus has circuitry to program a circuit of the apparatus. The apparatus can comprise a means to translate information from a signal at an input of the circuit to logic circuitry to program the circuit; and a device coupled to the input of the circuit and coupled to the means to translate information to provide the signal from the input of the circuit to the means to translate information. The device interfaces a voltage domain to the means to translate information, wherein the voltage domain is high relative to operating voltage of the means to translate information.

Variations of such apparatus or similar apparatus can include a number of different embodiments that may be combined depending on the application of such apparatus and/or the architecture of systems in which such apparatus are implemented. The apparatus can include a means to enable the device into an on-state to control current flow from an input side of the device to the means to translate information and disable the device to an off-state to isolate the means to translate information from the circuit. The means to translate information can be arranged to be operable to output a digital data signal or a digital clock signal to the logic circuitry. In various embodiments the device an include a transistor; the circuit can be an amplifier; and the information can be trim information to trim the amplifier. The transistor can be realized by a n-channel field effect enhancement mode device, a p-channel field effect enhancement mode device, n or p channel depletion mode devices and a transmission gate shorting the gate of the high voltage device to the source of the transistor, or any other kind of transistor. The amplifier can be an operational amplifier, a fully differential amplifier, a current sense amplifier, an instrumentation amplifier. Further, the circuit can be an analog-to-digital converter or a references circuit.

The following are example embodiments of integrated circuits or apparatus having circuitry to program a circuit of the respective integrated circuit or apparatus and methods of operation, in accordance with the teachings herein.

An example integrated circuit 1, having circuitry to program a circuit of example integrated circuit 1, can comprise: translation circuitry to provide information to program the circuit of the integrated circuit; and a device coupled to an input of the circuit and to the translation circuitry to provide a signal from the input of the circuit to the translation circuitry such that the device interfaces a voltage domain to the translation circuitry with the voltage domain being high relative to operating voltage of the translation circuitry.

An example integrated circuit 2, having circuitry to program a circuit of example integrated circuit 2, can include features of example integrated circuit 1 and can include the information being information to program one or more parameters of the circuit.

An example integrated circuit 3, having circuitry to program a circuit of example integrated circuit 3, can include features of any of the preceding example integrated circuits and can include the device being coupled to an enable node to receive an enable signal that controls current flow from an input side of the device to the translation circuitry.

An example integrated circuit 4, having circuitry to program a circuit of example integrated circuit 4, can include features of example integrated circuit 3 or features of any of the preceding example integrated circuits and can include the translation circuitry including a comparator to provide the information to logic circuitry of the integrated circuit to program the circuit.

An example integrated circuit 5, having circuitry to program a circuit of example integrated circuit 5, can include features of example integrated circuit 3 or features of any of the preceding example integrated circuits and can include the translation circuitry including a resistance to limit current over full range of operation of the device.

An example integrated circuit 6, having circuitry to program a circuit of example integrated circuit 6, can include features of any of the preceding example integrated circuits and can include the device isolating the translation circuitry from the circuit, when the device is in an off-state.

An example integrated circuit 7, having circuitry to program a circuit of example integrated circuit 7, can include features of any of the preceding example integrated circuits and can include the device including a transistor.

An example integrated circuit 8, having circuitry to program a circuit of example integrated circuit 8, can include features of any of the preceding example integrated circuits and can include the circuit including an amplifier and the information is trim information to trim the amplifier.

An example integrated circuit 9, having circuitry to program a circuit of example integrated circuit 9, can include features of any of the preceding example integrated circuits and can include the integrated circuit including second translation circuitry to provide additional information to program the circuit; and a second device coupled to the second translation circuitry to provide a second signal from a second input of the circuit to the second translation circuitry such that the second device interfaces a voltage domain that is high relative to operating voltage of the second translation circuitry.

An example integrated circuit 10, having circuitry to program a circuit of example integrated circuit 10, can include features of example integrated circuit 9 or features of any of the preceding example integrated circuits and can include the translation circuitry being operable to output a data signal to logic circuitry of the integrated circuit and the second translation circuitry is operable to output a clock signal to the logic circuitry.

An example apparatus 1, having circuitry to program a circuit of example apparatus 1, can comprise: a means to translate information from a signal at an input of the circuit to logic circuitry to program the circuit; and a device coupled to the input of the circuit and coupled to the means to translate information to provide the signal from the input of the circuit to the means to translate information such that the device interfaces a voltage domain to the means to translate information, wherein the voltage domain is high relative to operating voltage of the means to translate information.

An example apparatus 2, having circuitry to program a circuit of example apparatus 2, can include features of example apparatus 1 and can include means to enable the device into an on-state to control current flow from an input side of the device to the means to translate information and disable the device to an off-state to isolate the means to translate information from the circuit.

An example apparatus 3, having circuitry to program a circuit of example apparatus 3, can include features of any of the preceding example apparatus and can include the means to translate information being operable to output a digital data signal or a digital clock signal to the logic circuitry.

An example apparatus 4, having circuitry to program a circuit of example apparatus 4, can include features of any of the preceding example apparatus and can include the device including a transistor, the circuit being an amplifier, and the information being trim information to trim the amplifier.

An example method 1 of operating an integrated circuit to program a circuit in the integrated circuit can comprise: enabling a device coupled to translation circuitry and coupled to an input of the circuit of the integrated circuit, wherein the device interfaces a voltage domain to the translation circuitry with the voltage domain being high relative to operating voltage of the translation circuitry; providing a signal at the input of the circuit to provide information from the translation circuitry to logic circuitry to program the circuit, with the device enabled to an on-state; and controlling the signal to provide a digital output from the translation circuitry to the logic circuitry.

An example method 2 of operating an integrated circuit to program a circuit in the integrated circuit can include features of example method 1 and can include the information being information to program one or more parameters of the circuit.

An example method 3 of operating an integrated circuit to program a circuit in the integrated circuit can include features of any of the preceding example methods and can include the information to include trim information, serial numbers, or measured test results.

An example method 4 of operating an integrated circuit to program a circuit in the integrated circuit can include features of any of the preceding example methods and can include turning the device to an off-state, isolating the translation circuitry from the circuit.

An example method 5 of operating an integrated circuit to program a circuit in the integrated circuit can include features of any of the preceding example methods and can include controlling the signal including providing a data signal to the logic circuitry.

An example method 6 of operating an integrated circuit to program a circuit in the integrated circuit can include features of example method 5 or features of any of the preceding example methods and can include enabling a second device coupled to a second translation circuitry and coupled to a second input of the circuit, wherein the second device interfaces a voltage domain that is high relative to operating voltage of the second translation circuitry; providing a second signal at the second input of the circuit to provide information from the second translation circuitry to the logic circuitry to program the circuit, with the second transistor enabled to an on-state; and controlling the second signal to provide a clock signal from the second translation circuitry to the logic circuitry.

An example method 7 of operating an integrated circuit to program a circuit in the integrated circuit can include features of any of the preceding example methods and can include performing functions associated with any features of example integrated circuits 1-10 having circuitry to program a circuit of the respective example integrated circuit, example apparatus 1-4 having circuitry to program a circuit of the respective example apparatus, and any features of example integrated circuits or example apparatus associated with the figures herein.

In various embodiments, an interface circuit is provided to activate programming of a circuit of an integrated circuit that is straight forward to implement and takes up a small area on the die of the integrated circuit. The interface circuit can be implemented as an interface cell for circuit adjustment, where such an interface cell can be implemented for each input of multiple inputs to the circuit. The interface cell can include a control device and a low voltage circuit. The control device can interface a high voltage domain to a low voltage domain of the low voltage circuit. The control device can be implemented as a single device, or a device having a limited number of additional components, that interfaces high voltage to low voltage. The control device can be biased relative to an operating voltage of the circuit, which has an input in the high voltage domain, where the control device and its biasing allow for translation of signals between the two domains. The control device can be enabled to provide the signals to the low voltage circuit of the interface cell and disabled to isolate the circuit from the interface cell after providing the signals to the low voltage circuit of the interface cell.

The above detailed description refers to the accompanying drawings that show, by way of illustration and not limitation, various embodiments that can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The above detailed description is, therefore, not to be taken in a limiting sense.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. An integrated circuit having circuitry to program a programmable circuit of the integrated circuit, the integrated circuit comprising:
   translation circuitry including an output to program the programmable circuit of the integrated circuit; and
   interface circuitry coupled to an input of the programmable circuit and to the translation circuitry, wherein the interface circuitry interfaces a higher voltage domain to a different lower voltage domain that includes the translation circuitry, with the higher voltage domain providing a higher operating voltage to circuitry in the higher voltage domain and the lower voltage domain providing a lower operating voltage relative to the higher operating voltage to circuitry in the lower voltage domain.

2. The integrated circuit of claim 1, wherein the integrated circuit has an input pin shared by the interface circuitry and the input of the programmable circuit in the higher voltage domain.

3. The integrated circuit of claim 1, wherein the interface circuitry is coupled to an enable node to receive an enable signal to control current flow from an input side of the interface circuitry to the translation circuitry.

4. The integrated circuit of claim 3, wherein the translation circuitry includes a comparator responsive to an input signal to the interface circuitry, with the comparator providing a digital signal to logic circuitry of the integrated circuit.

5. The integrated circuit of claim 3, wherein the translation circuitry includes a resistance to limit current from the interface circuitry over a full range of operation of the interface circuitry.

6. The integrated circuit of claim 1, wherein the interface circuitry includes an off state to isolate the translation circuitry from the programmable circuit.

7. The integrated circuit of claim 1, wherein the interface circuitry, includes a field effect transistor having a source coupled to a gate of the field effect transistor by a diode, with a drain of the field effect transistor directly coupled to the input of the programmable circuit of the higher voltage domain and the source of the field effect transistor directly coupled to the translation circuitry of the lower voltage domain.

8. The integrated circuit of claim 1, wherein the programmable circuit includes a trimmable amplifier including a trim input coupled to an output of the translation circuitry to receive trim data.

9. The integrated circuit of claim 1, wherein the integrated circuit includes:
   second translation circuitry including a clock output to logic circuitry of the integrated circuit; and
   a second interface circuitry coupled to the second translation circuitry and coupled to a second input of the programmable circuit, wherein the second interface circuitry interfaces the higher voltage domain that is high relative to an operating voltage of the second translation circuitry.

10. The integrated circuit of claim 9, wherein the output of the translation circuitry is coupled to generate a data signal to the logic circuitry of the integrated circuit.

11. A method of operating an integrated circuit to program a programmable circuit in the integrated circuit, the method comprising:
   enabling interface circuitry coupled to translation circuitry and coupled to an input of the programmable circuit of the integrated circuit, wherein the interface circuitry interfaces a higher voltage domain to a different lower voltage domain that includes the translation circuitry, with the higher voltage domain providing a higher operating voltage to circuitry in the higher voltage domain and the lower voltage domain providing a lower operating voltage relative to the higher operating voltage to circuitry in the lower voltage domain;
   receiving a signal at the input of the programmable circuit to provide data from the translation circuitry to logic circuitry of the integrated circuit, with the interface circuitry enabled to an on-state; and controlling the signal to provide a digital output from the translation circuitry to the logic circuitry.

12. The method of claim 11, wherein the programmable circuit is a trimmable amplifier including a trim input coupled to an output of the translation circuitry to receive trim data.

13. The method of claim 11, wherein the data includes trim data, a serial number, or a measured test result.

14. The method of claim 11, wherein the method includes turning the interface circuitry to an off-state, isolating the translation circuitry from the programmable circuit.

15. The method of claim 11, wherein controlling the signal includes providing a data signal to the logic circuitry.

16. The method of claim 15, wherein the method includes:
enabling a second interface circuitry, the second interface circuitry coupled to a second translation circuitry and coupled to a second input of the programmable circuit, wherein the second interface circuitry interfaces the higher voltage domain that is high relative to operating voltage of the second translation circuitry;
providing a second signal at the second input of the programmable circuit, with the second interface circuitry enabled to an on-state; and
controlling the second signal to provide a clock signal from the second translation circuitry to the logic circuitry.

17. An apparatus having circuitry to program a programmable circuit of the apparatus, the apparatus comprising:
a means for translating data from a signal at an input of the programmable circuit to logic circuitry of the apparatus; and
a means for interfacing two circuits coupled to the input of the programmable circuit and coupled to the means for translating data to provide the signal from the input of the programmable circuit to the means for translating data, wherein the means for interfacing two circuits interfaces a higher voltage domain to a different lower voltage domain of the means for translating data, with the higher voltage domain providing a higher operating voltage to circuitry in the higher voltage domain and the lower voltage domain providing a lower operating voltage relative to the lei leer operating voltage to circuitry in the lower voltage domain.

18. The apparatus of claim 17, wherein the apparatus includes a means for enabling the means for interfacing two circuits into an on-state to control current flow from an input side of the means for interfacing two circuits to the means for translating data and to disable the means for interfacing two circuits to an off-state to isolate the means for translating data from the programmable circuit.

19. The apparatus of claim 17, wherein the means for translating data has an output to provide a digital data signal or a digital clock signal to the logic circuitry.

20. The apparatus of claim 17, wherein the means for interfacing two circuits includes a field effect transistor directly coupled to the input of the programmable circuit and directly coupled to the means for translating data, the programmable circuit is an amplifier, and the data is him data to trim the amplifier.

* * * * *